United States Patent
Lee

(10) Patent No.: US 7,501,706 B2
(45) Date of Patent: Mar. 10, 2009

(54) SEMICONDUCTOR DEVICES TO REDUCE STRESS ON A METAL INTERCONNECT

(75) Inventor: Jae Suk Lee, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 374 days.

(21) Appl. No.: 11/205,376

(22) Filed: Aug. 17, 2005

(65) Prior Publication Data

US 2006/0017168 A1   Jan. 26, 2006

Related U.S. Application Data

(62) Division of application No. 10/694,035, filed on Oct. 27, 2003, now Pat. No. 6,949,475.

(30) Foreign Application Priority Data

Dec. 30, 2002  (KR) .............. 10-2002-0086915

(51) Int. Cl.
*H01L 23/48* (2006.01)

(52) U.S. Cl. .............. 257/758; 257/765; 257/771; 257/E23.01

(58) Field of Classification Search .......... 257/758, 257/771, 765; 438/688
See application file for complete search history.

(56) References Cited

U.S. PATENT DOCUMENTS

| | | | | |
|---|---|---|---|---|
| 3,584,264 | A | * | 6/1971 | McLouski et al. ............ 257/794 |
| 4,499,653 | A | | 2/1985 | Kub et al. |
| 6,127,257 | A | * | 10/2000 | Pintchovski et al. ........ 438/625 |
| 6,544,886 | B2 | * | 4/2003 | Lu et al. ..................... 438/637 |
| 6,709,989 | B2 | | 3/2004 | Ramdani et al. |
| 6,949,475 | B2 | * | 9/2005 | Lee ............................ 438/763 |
| 2002/0009885 | A1 | * | 1/2002 | Brankner et al. ............ 438/688 |
| 2003/0104673 | A1 | * | 6/2003 | See et al. .................... 438/393 |
| 2003/0132472 | A1 | * | 7/2003 | Koizumi ..................... 257/296 |

* cited by examiner

*Primary Examiner*—Thanh Nguyen
(74) *Attorney, Agent, or Firm*—Saliwanchik, Lloyd & Saliwanchik

(57) ABSTRACT

Semiconductor devices to reduce stress on a metal interconnect are disclosed. A disclosed semiconductor device comprises: a semiconductor substrate; an uppermost metal interconnect formed on the semiconductor substrate; an oxide layer formed on the substrate and the uppermost metal interconnect; an aluminum layer formed on the oxide layer; and a stress-relief layer formed on the aluminum layer to thereby prevent cracking of the passivation layer during a subsequent packaging process, to increase reliability of the passivation layer, and to prevent degradation of properties of the semiconductor device.

5 Claims, 2 Drawing Sheets

SEMICONDUCTOR DEVICES TO REDUCE STRESS ON A METAL INTERCONNECT

RELATED APPLICATION

This patent arises from a divisional application that claims the benefit of U.S. patent application Ser. No. 10/694,035, filed on Oct. 27, 2003 now U.S. Pat. No. 6,949,475.

FIELD OF THE DISCLOSURE

This disclosure relates generally to semiconductor devices, and, more particularly, to semiconductor devices and methods of fabricating the same.

BACKGROUND

Generally, a passivation layer is a final protection layer of a semiconductor device. The passivation layer is typically formed on an uppermost metal interconnect of the device, and serves to prevent scratching and/or contamination of a foreign substance on a chip surface during the packaging process. Such a passivation layer functions as a means for protecting the semiconductor device from environmental factors such as external moisture. The passivation layer can be formed by a combination of various oxide layers for stress-relief with a nitride layer serving as an excellent protection layer.

In the prior art, the passivation layer has, in some instances, been fabricated by depositing a Plasma Enhanced-Tetra-Ethyl-Ortho-Silicate (PE-TEOS) oxide layer using a Plasma Enhanced Chemical Vapor Deposition (PECVD) on a semiconductor substrate on which an uppermost metal interconnect for the semiconductor device has been formed, and subsequently depositing a $SiH_4$ nitride layer using PECVD. Also, the passivation layer has been fabricated by depositing a $SiH_4$ oxide layer using a high density plasma Chemical Vapor Deposition (HDPCVD) process and subsequently depositing a $SiH_4$ nitride layer using PECVD.

For a semiconductor device such as a multi-interconnect adapted device or a power device, the uppermost metal interconnect, (for example, a metal interconnect made of aluminum) is formed to have a thickness of 8000 to 10000 Å. In contrast, the uppermost metal interconnect of a conventional semiconductor device is formed to have a thickness of 5000 to 6000 Å. Further, the uppermost metal interconnect of the power device is typically formed in a relatively larger area.

However, because the passivation layer experiences a large stress for the thick and wide uppermost metal interconnect, a crack has often occurred in the passivation layer of prior art multi-interconnect adapted devices or prior art power devices during the packaging process. In other words, this stress has caused an increased incidence of defects in semiconductor products that are manufactured using a packaging process.

To reduce the incidence of defects in the semiconductor devices such as cracks of the passivation layer, it has been required that the passivation layer for the uppermost metal interconnect be subjected to low levels of stress, and that the passivation layer be composed of a high hardness material which is resistant to external shocks.

Figure 1:
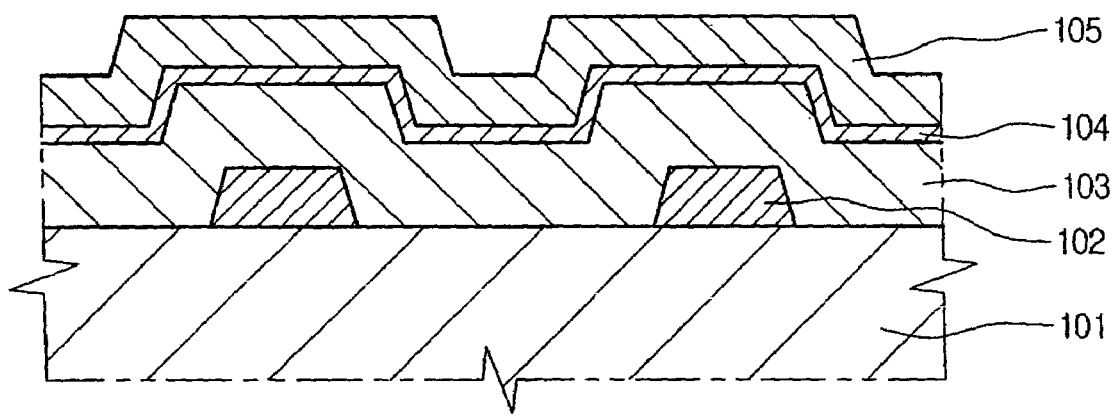
FIG. 1 is a cross-sectional view of an example semiconductor device.

DETAILED DESCRIPTION.

Hereinafter, an example semiconductor device will be described with reference to the accompanying drawings. The same reference numerals are used to designate the same or similar components throughout the following description and drawings. Therefore, repetition of the description of the same or similar components will be omitted.

FIG. 1 is a cross-sectional view of an example semiconductor device. Referring to FIG. 1, the uppermost metal interconnects 102 are formed on a semiconductor substrate 101. The uppermost metal interconnects 102 are spaced apart with a predetermined distance therebetween. An oxide layer 103 (such as an undoped silica glass (USG) or a fluorinated silica glass (FSG)) is formed on the metal interconnects 102 using a high density plasma Chemical Vapor Deposition (HD-PCVD) method. An aluminum layer 104 is formed on the oxide layer 103 on the front surface of the substrate 101 using a sputtering method. An aluminum oxide layer 105, (i.e., a stress-relief layer 105), is formed on the aluminum layer 104.

Since the stress-relief layer 105 is less susceptible to stress than the metal interconnects 102 and has a high hardness, it serves to relieve stress experienced by the metal interconnects 102. Formation of the stress-relief layer 105 makes it possible to prevent the leakage current of the semiconductor device from being increased and breakdown voltage thereof being reduced.

The aluminum oxide layer 105 is a kind of $Al_xO_y$ layer (e.g., $Al_2O_3$ layer) formed on the aluminum layer 104. The $Al_xO_y$ layer is formed by performing a plasma treatment to the aluminum layer 104 using $N_2O$ or $O_2$ gas and annealing the treated layer in an atmosphere of inert gas, such as Ar or He, or of gas, such as $N_2O_2$, $N_2$ or $H_2$, etc. at a low temperature of, for example, 200 to 400° C. for 10 to 100 minutes.

Although persons of ordinary skill in the art will appreciate that, in addition to the structures discussed above, the illustrated semiconductor substrate 101 may also comprise other conventional structures such as, for example, a diffusion layer (e.g., a source/drain), a gate electrode, an interlayer dielectric, a metal interconnect and so forth, those additional structures have not been shown in the drawings because they are conventional and irrelevant to the subject of this disclosure. Also, although for clarity of illustration only two uppermost metal interconnects 102 are shown in the drawings, more than two uppermost metal interconnects 102 may be placed on the semiconductor substrate 101.

Figure 2:
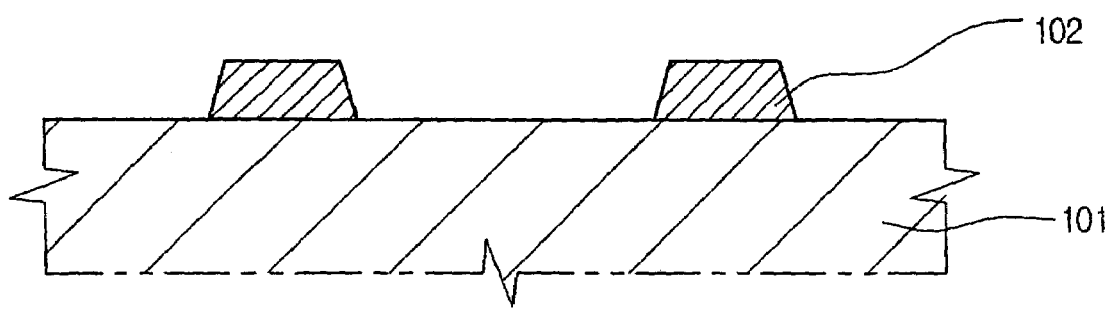
FIGS. 2 to 4 are cross-sectional views of the semiconductor device of FIG. 1 at different stages of a fabrication process.
Figure 3:
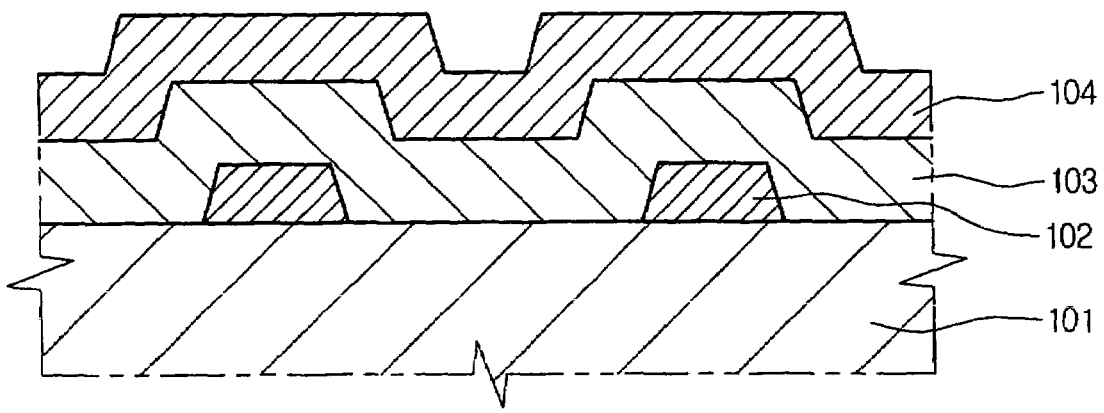
Figure 4:
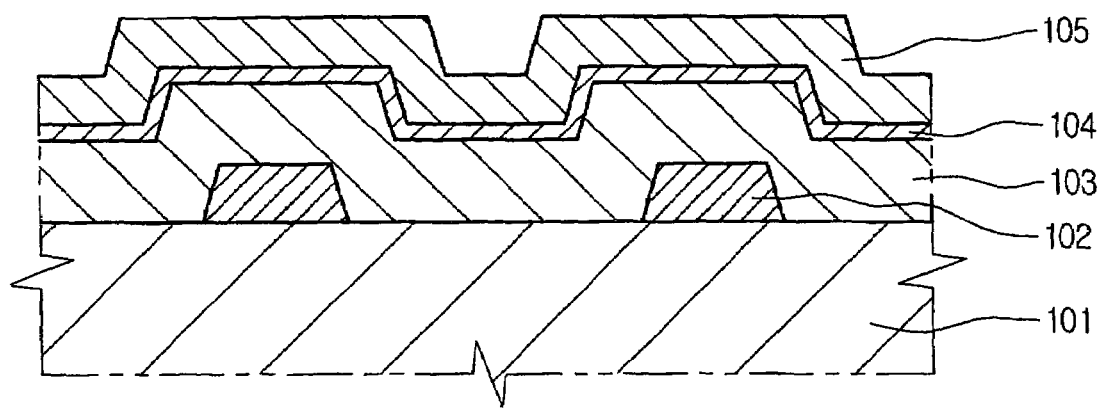

FIGS. 2 to 4 are cross-sectional views of the semiconductor device of FIG. 1 shown at various times of an example fabrication process. As shown in FIG. 2, a semiconductor substrate 101 is first formed. As discussed above, the semiconductor substrate 101 may include, for example, a diffusion layer (e.g., a source/drain), a gate electrode, an interlayer dielectric, a metal interconnect and/or other conventional structures. However, those conventional structures are omitted from the drawings as irrelevant to the present discussion.

A metal layer for creating the uppermost metal interconnects 102 is deposited in a thickness of 8000 to 10000 Å on the semiconductor substrate 101 using, for instance, a sputtering process. Then, using photolithography, a photoresist pattern (not shown) corresponding to the uppermost metal interconnects 102 is formed on the metal layer to create an etching mask. The portion(s) of the metal layer which are not masked by the photoresist pattern are then etched until the portion(s) of the semiconductor substrate 101 under the exposed portion(s) of the metal layer are exposed.

The uppermost metal interconnects 102 are thus formed on the semiconductor substrate 101 in a desired pattern.

Although only two uppermost metal interconnects 102 are shown in the drawings, persons of ordinary skill in the art will appreciate that more than two uppermost metal interconnects 102 are typically placed on the semiconductor substrate 101.

Referring to FIG. 3, after the uppermost metal interconnects 102 are formed, an oxide layer 103 (e.g., USG or FSG) is formed over the semiconductor substrate 101 and the metal interconnects 102 using a High Density Plasma Chemical Vapor Deposition (HDPCVD) method. Then, an aluminum layer 104 is formed on the oxide layer 103 using a sputtering method. The aluminum layer 104 preferably has a thickness of 2000 to 3000 Å.

Referring to FIG. 4, an aluminum oxide layer 105 (such as, for example, an $Al_xO_y$ layer), is formed on the aluminum layer 104 to create a stress-relief layer 105. The aluminum oxide layer 105 may be formed by performing a plasma treatment to the aluminum layer 104 using $N_2O$ or $O_2$ gas. As the aluminum layer 104 is oxidized into the aluminum oxide layer, the thickness of the remaining aluminum layer 104 is reduced to 100 to 300 Å.

After the aluminum oxide layer 105 is formed, the aluminum oxide layer 105 is annealed in an atmosphere of inert gas, such as Ar or He, or in an atmosphere of gas, such as $N_2O_2$, $N_2$, $H_2$, etc. at a low temperature of, for example, 200 to 400° C. for 10 to 100 minutes by a rapid thermal process or a heat treatment using a conventional furnace. Accordingly, the aluminum oxide layer 105 is formed into a stress-relief layer 105.

Since the stress-relief layer 105 has a high hardness characteristic and a low stress susceptibility relative to the metal interconnects 102, the stress-relief layer 105 serves to relieve stress for the metal interconnects 102. Formation of the stress-relief layer 105 prevents cracking during a subsequent packaging process, so that leakage current of the semiconductor device may be reduced and the breakdown voltage thereof may be increased.

Accordingly, the aluminum oxide layer 105 can be used as a passivation layer. Thus, defects due to cracking caused by external shocks occurring during the packaging process are reduced.

As described above, the illustrated semiconductor device is manufactured by forming an uppermost metal interconnect 102 on a semiconductor substrate 101; forming an oxide layer 103 and an aluminum layer 104 on the uppermost metal interconnect 102, and forming an aluminum oxide layer 105 as a passivation layer and a stress-relief layer, thereby preventing cracking due to the external shocks occurring during a subsequent packaging process, reducing leakage current of the semiconductor device, and increasing the breakdown voltage.

From the foregoing, persons of ordinary skill in the art will appreciate that the above disclosed methods and apparatus reduce stress for the uppermost metal interconnect 102, thereby preventing cracking of the passivation layer during a subsequent packaging process without affecting the RC delay of the uppermost metal interconnect 102.

To this end, the illustrated semiconductor device includes a semiconductor substrate 101; an uppermost metal interconnect 102 formed on the semiconductor substrate 101; an oxide layer 103 formed on the substrate 101 and on the uppermost metal interconnect 102; an aluminum layer 104 formed on the oxide layer 103; and a stress-relief layer 105 formed on the aluminum layer 104.

Preferably, the stress-relief layer 105 is composed of an aluminum oxide layer.

Preferably, the aluminum layer 104 is formed in a thickness of 100 to 300 Å.

Preferably, the oxide layer 105 is formed of an undoped silica glass (USG) or a fluorinated silica glass (FSG).

An example method for manufacturing a semiconductor device is also disclosed. In the method, an uppermost metal interconnect 102 is formed on a semiconductor substrate 101; an oxide layer 103 is formed on the substrate 101 and the metal interconnect 102; an aluminum layer 104 is formed on the oxide layer 103; and a stress-relief layer 105 for reducing the stress experienced by the metal interconnect 102 is formed on the aluminum layer 104.

Preferably, the stress-relief layer is formed by performing a plasma treatment on the surface of aluminum layer 104 to form an aluminum oxide layer; and annealing the aluminum oxide layer.

Preferably, the plasma treatment is a process using $N_2O$ gas or $O_2$ gas.

Preferably, the annealing of the aluminum oxide layer is performed at a temperature of 200 to 400° C.

Preferably, the annealing of the aluminum oxide layer is performed in an atmosphere of inert gas, such as Ar or He, or of a non-inert gas, such as, for example, $N_2O_2$, $N_2$, $H_2$, or a mixture thereof.

It is noted that this patent claims priority from Korean Patent Application Serial Number 10-2002-0086915, which was filed on Dec. 30, 2002, and is hereby incorporated by reference in its entirety.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A semiconductor device comprising:
   a semiconductor substrate;
   an uppermost metal interconnect formed on the semiconductor substrate;
   an oxide layer formed on the uppermost metal interconnect, wherein the oxide layer is on the entire top surface of the uppermost metal interconnect;
   an aluminum layer formed on the oxide layer; and
   a stress-relief layer formed on the aluminum layer.

2. A semiconductor device as defined in claim 1, wherein the stress-relief layer comprises an aluminum oxide layer.

3. A semiconductor device as defined in claim 1, wherein the aluminum layer is formed in a thickness of 100 to 300 Å.

4. A semiconductor device as defined in claim 1, wherein the oxide layer is formed of one of an undoped silica glass and a fluorinated silica glass.

5. A semiconductor device as defined in claim 1, wherein the semiconductor device is at least one of a multi-interconnect adapted device and a power device.

* * * * *